United States Patent
Saito

(10) Patent No.: US 11,230,795 B2
(45) Date of Patent: Jan. 25, 2022

(54) SILICA-GLASS CRUCIBLE AND PRODUCTION METHOD THEREOF

(71) Applicant: COORSTEK KK, Tokyo (JP)

(72) Inventor: Ryohei Saito, Yamagata (JP)

(73) Assignee: COORSTEK KK, Tokyo (JP)

( * ) Notice: Subject to any disclaimer, the term of this patent is extended or adjusted under 35 U.S.C. 154(b) by 62 days.

(21) Appl. No.: 16/714,322

(22) Filed: Dec. 13, 2019

(65) Prior Publication Data

US 2020/0190688 A1 Jun. 18, 2020

(30) Foreign Application Priority Data

Dec. 13, 2018 (JP) .............................. JP2018-233607
Dec. 27, 2018 (JP) .............................. JP2018-244033
Oct. 1, 2019 (JP) .............................. JP2019-181105
Oct. 1, 2019 (JP) .............................. JP2019-181106

(51) Int. Cl.
*C30B 15/10* (2006.01)

(52) U.S. Cl.
CPC .................................... *C30B 15/10* (2013.01)

(58) Field of Classification Search
CPC ............... C30B 15/10; Y10T 117/1032; Y10T 117/1052; C03B 20/00
See application file for complete search history.

(56) References Cited

U.S. PATENT DOCUMENTS

| | | | |
|---|---|---|---|
| 2010/0107965 A1* | 5/2010 | Fukui | C30B 29/06 117/35 |
| 2011/0011334 A1* | 1/2011 | Shimazu | C03B 19/095 117/208 |
| 2013/0247818 A1* | 9/2013 | Wang | C03C 17/005 117/208 |
| 2013/0248408 A1* | 9/2013 | Yamagata | C30B 35/002 206/524.6 |

FOREIGN PATENT DOCUMENTS

| | | |
|---|---|---|
| JP | 2000-247778 A | 9/2000 |
| JP | 2002179495 A | 6/2002 |
| JP | 2005-231986 A | 9/2005 |
| JP | 2009084085 A | 4/2009 |
| JP | 2010-275151 A | 12/2010 |
| JP | 2014-005154 A | 1/2014 |

OTHER PUBLICATIONS

Notification of Reason for Refusal for related KR App No. 10-2019-0165430 dated Jan. 22, 2021, 14 pgs.

* cited by examiner

*Primary Examiner* — Robert M Kunemund
(74) *Attorney, Agent, or Firm* — Procopio, Cory, Hargreaves & Savitch LLP

(57) ABSTRACT

The present invention relates to a silica-glass crucible for pulling up single-crystal silicon therefrom by Czochralski method (CZ method) or for melting an optical-glass, which includes a crystallization promoter, and method of producing the silica-glass crucible in which a raw-material silica powder including Al and Ca at a specific molar concentration ratio is molded.

4 Claims, 12 Drawing Sheets

(Al/Ca molar ratio: 7.43)

Crucible inner surface side

↑

↓

Crucible outer surface side (Al/Ca molar ratio: 2.44)

Crucible inner surface side

↑

↓

Crucible outer surface side

SILICA-GLASS CRUCIBLE AND PRODUCTION METHOD THEREOF

TECHNICAL FIELD

The present invention relates to a silica-glass crucible for pulling up single-crystal silicon therefrom by Czochralski method (hereinafter referred to as "CZ method"), or for melting an optical-glass, and method of producing the silica-glass crucible.

BACKGROUND ART

As melting container for casting silicon or producing optical glasses, use is made of crucibles made of quartz glass or carbon. For example, polycrystalline silicon for use in solar cells is produced by a method in which a silicon melt contained in a crucible is solidified in one direction from the surface of the bottom of the crucible to form columnar crystals. Meanwhile, for producing single-crystal silicon, the Czochralski (CZ) method is generally used. In this method, the surface of a silicon melt is in contact with a seed crystal by means of the surface tension of the melt, and the seed crystal is grown by utilizing forced convection of the silicon melt. This seed crystal is pulled up while being rotated on the silicon melt in the opposite direction, thereby growing a single-crystal ingot on the lower end of the seed crystal. An optical glass is produced, for example, by dropping a molten glass from the tip of a nozzle to produce a droplet-form glass to obtain a preform glass, or by casting and rapidly cooling a molten glass to temporarily produce a glass block and then grinding, polishing, and cleaning the glass block to obtain a preform glass.

For example, for producing a silica-glass crucible for melting an optical-glass, natural raw-material silica is used. Meanwhile, a silica-glass crucibles for pulling up single-crystal silicon may have a configuration including an inner layer that is a transparent layer of a high-purity synthetic-quartz glass and an outer layer that is an opaque layer of a natural-quartz glass, which has a lower purity than the inner layer and is inexpensive.

Meanwhile, silica-glass crucibles are increasing in size year by year, and the size enlargement in silica-glass crucibles is for pulling up single-crystal silicon having larger diameters. The size enlargement in silica-glass crucibles has a merit in that the amount of polycrystalline silicon to be charged into the silica-glass crucible and to be heated to obtain a silicon melt can be increased and single-crystal silicon having an increased length can be pulled up, thereby improving the throughput.

However, the silica-glass crucible having an increased size must be used under severer environments because the melting period for converting polycrystalline silicon into a silicon melt is prolonged and the silica-glass crucible is exposed to higher temperatures than before due to an increase in the output of the carbon heater for heating. Such environments exert considerable adverse influences on the silica-glass crucible.

Nowadays, as a result of the trend toward larger diameters in single-crystal silicon, the raw-material silicon melt heated to 1,400° C. or higher has come to be held for a prolonged period in the crucible and this has resulted in a tendency that the inner surface of the crucible reacts with the silicon melt to cause crystallization in a shallow layer in the inner surface or the quartz glass constituting the crucible has a reduced viscosity to make the crucible more prone to devitrify or deform. The increased diameters of single-crystal silicon necessitate use of a raw-material silicon melt in a larger amount and have resulted in an increased weight burden to the crucible, and there is a concern with crucible embrittlement such as cracking or a melt leakage. Furthermore, in cases when the crucible itself has an increased size in accordance with the increase in the amount of the raw-material silicon melt, the raw-material silicon melt undergoes increased surface vibration.

For example, conventional silica-glass crucibles have a small viscosity value at high temperatures and it is difficult for the conventional crucibles to retain their shapes over a long period in high-temperature environments of 1,400° C. or higher. Because of this, deformations of the silica-glass crucibles have posed problems in the step of pulling up single-crystal silicon, such as fluctuations in the surface level of the silicon melt and a decrease in the degree of conversion into single-crystal silicon (ratio between the weight of single-crystal silicon pulled up and the weight of polycrystalline silicon charged into the crucible).

Consequently, silica-glass crucibles, in particular, large silica-glass crucibles, are required to have strength which prevents the crucibles from deforming even at high temperatures and which can inhibit the raw-material silicon melt contained in the crucible from undergoing surface vibration.

A technique has hitherto been used for inhibiting a crucible from deforming at high temperatures, in which aluminum (Al) is added to a raw-material quartz powder to obtain quartz glass having an increased viscosity and promote crystallization. Meanwhile, in case where the aluminum concentration in the quartz glass is too high, the crystallization of the crucible proceeds rapidly to form a thick crystalline layer and this crucible may crack during cooling, leading to a melt leakage. In order to overcome such problem, Patent Document 1, for example, discloses a quartz-glass crucible which includes an outer layer formed from a raw material of quartz glass which has an aluminum concentration of 8.8-15 wt ppm, a sodium (Na) concentration less than 0.1 wt ppm, a potassium (K) concentration less than 0.2 wt ppm, and a lithium (Li) concentration of 0.3-0.8 wt ppm and in which the molar concentration ratio of Al to Li (Al/Li) is 7.5 or less. Li functions to inhibit crystallization and, hence, serves to moderately lessen the crystallization-promoting function of Al. In Patent Document 1, an outer layer is formed from a raw material of quartz glass which contains Al and Li in the given amounts, thereby imparting excellent strength characteristics to the crucible.

Patent Document 2 describes a quartz-glass crucible including an opaque outer layer formed by melting a natural-silica powder and a transparent inner layer made of synthetic-quartz glass, and discloses a feature that a portion of the inner layer which ranges from the inner surface to a depth of 0.8 mm therefrom is regulated so as to have an average aluminum concentration of 1-20 ppm and have an average OH group concentration of 150-300 ppm to thereby moderately generate cristobalite. Therefore, the crucible thus produced not only is less apt to suffer glass surface dissolution even when used in a long-term operation, enabling to improve yield of single-crystal silicon to be pulled up, but also is effective in inhibiting the silicon melt surface from vibrating.

The chemical purity of a raw material of quartz glass, which is determined by subtracting the contents of metal impurities (Al, Fe, Na, K, etc.) from 100, can be usually ascertained numerically in acceptance inspection of the delivered raw material. However, the devitrification property of the quartz glass is not ascertained until a crucible is actually produced and thereafter examined by a destructive inspection. Namely, it is difficult to estimate the devitrification property only from the results of an examination for determining the contents of those metal impurities, and it has been impossible to assess the devitrification property before use without destroying the crucible.

In order to overcome those problems of deformation or damage of crucibles, Patent Document 3 proposes a quartz-glass crucible having a three-layer structure composed of an Al-containing quartz layer as an outer layer, a natural-quartz layer as an interlayer, and a high-purity synthetic-quartz layer as an inner layer. This crucible has a feature that the outer layer crystallizes to cristobalite when heated at a temperature of 1,200° C. or higher for a given period during heating in the step of pulling up single-crystal silicon. The growth of the cristobalite improves the viscosity and the crystallization can bring about high durability, making it possible to overcome the problems such as the deformation or damage of crucibles.

Meanwhile, in case where particles of an outer layer to which a crystallization promoter has been added come into the inside of the crucible, this affects the durability of the crucible and the degree of conversion into single crystal. The present applicant hence has proposed a means described in Patent Document 4 for inhibiting particles of an outer layer containing a crystallization promoter from coming into the inside of the crucible at the time when a packaging material covering the opening of the unused crucible is removed or when suction pads are attached to and removed from a portion around the opening of the crucible.

Specifically, in Patent Document 4, a crucible in which any outer layer containing a crystallization promoter has not been formed in a region extending from the upper end of the crucible to a distance of 30-50 mm therefrom, in order to inhibit particles of an outer layer containing a crystallization promoter from coming into the inside of the crucible is proposed.

Patent Document 1: JP-A-2014-5154
Patent Document 2: JP-A-2005-231986
Patent Document 3: JP-A-2000-247778
Patent Document 4: JP-A-2010-275151

SUMMARY OF INVENTION

An object of the present invention is to provide a method for producing an opaque silica-glass crucible which is less apt to devitrify, in which a natural-silica powder containing given amounts of an Al ingredient and a Ca ingredient is used as a raw material for the silica-glass crucible and in which moderately crystallized quartz glass is yielded to inhibit the crucible from deforming or cracking. In addition, an object of the present invention is to provide a silica-glass crucible including a given amounts of an Al ingredient and a Ca ingredient.

In the crucible described in Patent Document 4, since no outer layer containing a crystallization promoter has been formed in the region which extends from the upper end of the crucible to a distance of 30-50 mm therefrom, particles of an outer layer containing a crystallization promoter are inhibited from coming into the inside of the crucible, thereby attaining improvements in durability and the degree of conversion into single crystal. However, a phenomenon is observed in which the upper-end region of the crucible deforms (becomes inclined) inward.

In cases when the upper-end region of the crucible deforms (becomes inclined) inward during the step of pulling up single-crystal silicon, the flow of a gas within the pulling device is disturbed, resulting in a possibility that the single-crystal silicon pulled up might not have required crystal properties. In cases when the upper-end region of the crucible has considerably deformed, the upper-end region of the crucible may come into contact with the ingot (single-crystal silicon), making it impossible to continue the pulling of the ingot.

In the case of the crucible described in Patent Document 3, since a layer containing a crystallization promoter has been formed up to the opening upper end (upper end of the mouth) of the crucible, there is a possibility that cracks might generate, upon crystallization, from the outer peripheral surface of the opening upper end portion of the crucible and crack propagation toward the bottom part of the crucible might result in a melt leakage.

In order to overcome those problems, the present inventors diligently made investigations that a region where an outer layer containing a crystallization promoter was not to be formed was specified to thereby inhibit cracks from generating from around the opening of the crucible (from the upper end of the crucible) and inhibit an upper-end region of the crucible from deforming (becoming inclined) inward. The inventors have thus achieved the present invention.

An object of the present invention, which has been achieved under these circumstances, is also to provide a silica-glass crucible including an outer layer containing a crystallization promoter, in which cracks are inhibited from generating from the opening of the crucible (from the upper end of the crucible) and an upper-end region of the crucible is inhibited from deforming (becoming inclined) inward.

That is, the present invention relates to the following (1) to (11).

(1) A silica-glass crucible including Al and Ca.

(2) The silica-glass crucible according to (1) above, having an aluminum concentration of 55-100 wt ppm and a calcium concentration of 1.2-9.5 wt ppm, which are determined by a chemical purity analysis, and having a molar concentration ratio (Al/Ca) calculated from the aluminum concentration and the calcium concentration of 15 or higher.

(3) A method of producing the silica-glass crucible according to (2) above, the method including:

a step 1 of charging a raw-material silica powder having a molar concentration ratio (Al/Ca) calculated from an aluminum concentration and a calcium concentration which are determined by a chemical purity analysis of 15 or higher, into a rotating mold to conduct forming; and a step 2 of inserting an arc electrode into the mold and vitrifying a layer of the raw-material silica powder accumulated on an inner surface of the mold by an arc-melting.

(4) The method of producing the silica-glass crucible, according to (3) above, in which the raw-material silica powder in the step 1 has the aluminum concentration of 55-100 wt ppm and the calcium concentration of 1.2-9.5 wt ppm.

(5) The silica-glass crucible according to (1) above, including:

a bottom part;

a bottom corner formed around the bottom part; and a lateral part extending upward from the bottom corner, in which:

the silica-glass crucible has a crucible upper-end region;

the crucible upper-end region is a region extending from an upper end of the crucible downward to a distance therefrom of 5 mm or longer but not longer than a distance of a sum of an upper-end wall thickness and 10 mm;

the crucible upper-end region has a two-layer structure including an opaque outer layer including a natural-materialderived silica glass and a transparent inner layer including a natural-material-derived silica glass or a synthetic-material-derived silica glass; and the silica-glass crucible has a structure including at least three layers including, from a lower end of the crucible upper-end region, an outer layer including a crystallization-promoter-containing silica glass, an opaque interlayer which is continuously formed from the opaque outer layer of the crucible upper-end region, and the transparent inner layer.

(6) The silica-glass crucible according to (5) above, in which the crystallization-promoter-containing silica glass includes Al and Ca, has an aluminum concentration of 9-20 wt ppm and a calcium concentration of 0.1-0.6 wt ppm, and has a molar concentration ratio (Al/Ca) between Al and Ca in a range of 15≤Al/Ca≤200.

(7) The silica-glass crucible according to (5) or (6) above, having a four-layer structure including an opaque outer layer including a natural-material-derived silica glass superposed on an outer surface of the outer layer including the crystallization-promoter-containing silica glass.

(8) The silica-glass crucible according to any one of (5) to (7) above, in which the upper end of the crucible has the wall thickness of 10-18 mm.

(9) A silica-glass crucible, including:
a bottom part;
a bottom corner formed around the bottom part; and
a lateral part extending upward from the bottom corner, in which:
the silica-glass crucible has a crucible upper-end region;
the crucible upper-end region is a region extending from an upper end of the crucible downward to a distance therefrom of 5 mm or longer but not longer than a distance of a sum of an upper-end wall thickness and 10 mm;
the crucible upper-end region has a two-layer structure including an opaque outer layer including a natural-material-derived silica glass and a transparent inner layer including a natural-material-derived silica glass or a synthetic-material-derived silica glass; and
the silica-glass crucible has a structure including at least three layers including, from a lower end of the crucible upper-end region, an outer layer including a crystallization-promoter-containing silica glass, an opaque interlayer which is continuously formed from the opaque outer layer of the crucible upper-end region, and the transparent inner layer.

(10) The silica-glass crucible according to (9) above, having a four-layer structure including an opaque outer layer including a natural-material-derived silica glass superposed on an outer surface of the outer layer including the crystallization-promoter-containing silica glass.

(11) The silica-glass crucible according to (9) or (10) above, in which the upper end of the crucible has the wall thickness of 10-18 mm.

The method of the present invention for producing a silica-glass crucible includes: step 1 in which a raw-material silica powder having a molar concentration ratio (Al/Ca), as calculated from an aluminum concentration and a calcium concentration which were determined by a chemical purity analysis, of 15 or higher is charged into a rotating mold and formed; and step 2 in which arc electrodes are inserted into the mold and a layer of the raw-material silica powder accumulated on the inner surface of the mold is arc-melted and vitrified.

In step 1, in the raw-material silica powder, the aluminum concentration is preferably 55-100 wt ppm and the calcium concentration is preferably 1.2-9.5 wt ppm.

The raw-material silica powder having such a composition is less uneven in viscosity and gives a silica-glass crucible having excellent strength which prevents the crucible from deforming even when held at a high temperature of 1,400° C. or higher over a long period and which prevents the crucible from suffering cracking or a melt leakage due to a volume change during cooling.

The present invention further provides a silica-glass crucible which has an aluminum concentration of 55-100 wt ppm and a calcium concentration of 1.2-9.5 wt ppm, which were determined by a chemical purity analysis, and has a molar concentration ratio (Al/Ca), as calculated from the aluminum concentration and the calcium concentration, of 15 or higher.

The silica-glass crucible according to the present invention, which is for overcoming the problems described above, is a silica-glass crucible including: a bottom part; a bottom corner formed around the bottom part; and a lateral part extending upward from the bottom corner, in which: the silica-glass crucible has a crucible upper-end region; the crucible upper-end region is a region extending from an upper end of the crucible downward to a distance therefrom of 5 mm or longer but not longer than a distance of a sum of an upper-end wall thickness and 10 mm; the crucible upper-end region has a two-layer structure including an opaque outer layer including a natural-material-derived silica glass and a transparent inner layer including a natural-material-derived silica glass or a synthetic-material-derived silica glass; and the silica-glass crucible has a structure including at least three layers including, from a lower end of the crucible upper-end region, an outer layer including a crystallization-promoter-containing silica glass, an opaque interlayer which is continuously formed from the opaque outer layer of the crucible upper-end region, and the transparent inner layer.

As shown above, the outer layer made of crystallization-promoter-containing silica glass has not been formed in the crucible upper-end region, which extends from the upper end of the crucible downward to a distance therefrom of 5 mm or longer but not longer than the distance of sum of the upper-end wall thickness and 10 mm.

Because of this, not only cracks can be inhibited from generating from around the opening of the crucible (from the upper end of the crucible) but also the crucible upper-end region can be inhibited from deforming (becoming inclined) inward. This crucible hence can have improved durability, and an improvement in the degree of conversion into single crystal can be attained. Furthermore, the problem that a single-crystal silicon has a defect of crystal quality due to the inward deformation (inclination) of the crucible upper-end region can be eliminated.

In case where the crucible upper-end region extends from the upper end of the crucible downward to a distance therefrom of less than 5 mm, cracks generate from the outer peripheral surface around the upper end of the crucible, and it is hence undesirable. Meanwhile, in case where the crucible upper-end region extends beyond the distance of sum of the wall thickness of the upper end of the crucible and 10 mm, this crucible upper-end region deforms (becomes inclined) inward, and it is hence undesirable.

The preferable crystallization promoter to be contained in the outer layer is specifically Al and Ca. The aluminum concentration and calcium concentration in the crystallization-promoter-containing silica glass are desirably 9-20 wt ppm and 0.1-0.6 wt ppm, respectively. The molar concentration ratio between Al and Ca (Al/Ca) is desirably in the range of 15≤Al/Ca≤200.

It is desirable that the silica-glass crucible has a four-layer structure formed by further superposing an opaque outer layer made of natural-material-derived silica glass on the outer surface of the outer layer of crystallization-promoter-containing silica glass.

It is desirable that the upper end has a wall thickness of 10-18 mm. In case where the wall thickness of the upper end of the crucible is less than 10 mm, the crucible may be damaged and has poor durability. Such too small a wall thickness is hence undesirable. In case where the wall thickness of the upper end exceeds 18 mm, this is undesirable since this crucible has an unnecessarily increased weight. In cases when the wall thickness of the upper end is 10-18 mm, the crucible upper-end region extends from the upper end of the crucible downward to a distance therefrom of 5 mm or longer but not longer than 20-28 mm.

In this case, the outer layer containing a crystallization promoter is formed in the region shown in Patent Document 4 which extends from the upper end of the crucible to a distance of 30-50 mm therefrom. Care should hence be taken not to permit particles of an outer layer containing a crystallization promoter to come into the inside of the crucible at the time when a packaging material covering the opening of the unused crucible is removed or when suction pads are attached to and removed from a portion around the opening of the crucible.

According to the present invention, since a silica powder having a molar concentration ratio (Al/Ca), as calculated from the aluminum concentration and the calcium concentration, of 15 or higher is used as a raw material for a silica-glass crucible, the raw material has a reduced unevenness in viscosity to obtain quartz glass which has moderately crystallized, making it possible to produce a silica-glass crucible reduced in devitrification and retaining strength. This silica-glass crucible can be inhibited from deforming or cracking even when kept being heated over a longer period and can inhibit the surface of the raw-material silicon melt from vibrating, even when having an increased size. Specifically, in cases when a raw-material natural-silica powder which has an Al/Ca molar ratio determined by a chemical purity analysis of 15 or higher and which, preferably, has an aluminum concentration of 55-100 wt ppm and a calcium concentration of 1.2-9.5 wt ppm is used, a silica-glass crucible inhibited from undergoing defect of devitrification can be produced. Namely, the devitrification property of quartz glass can be assessed in the raw-material stage, without destroying the silica-glass crucible to evaluate the devitrification. According to the present invention, production of a silica-glass crucible reduced in the occurrence of defect of devitrification leading to damage to the crucible can be achieved by determining whether raw materials are usable or not.

According to the present invention, it is possible to obtain a silica-glass crucible which includes an outer layer containing a crystallization promoter and in which cracks are inhibited from generating from around the opening of the crucible (from the upper end of the crucible) and an upper-end region of the crucible is inhibited from deforming (becoming inclined) inward.

DESCRIPTION OF EMBODIMENTS

Figure 1A:
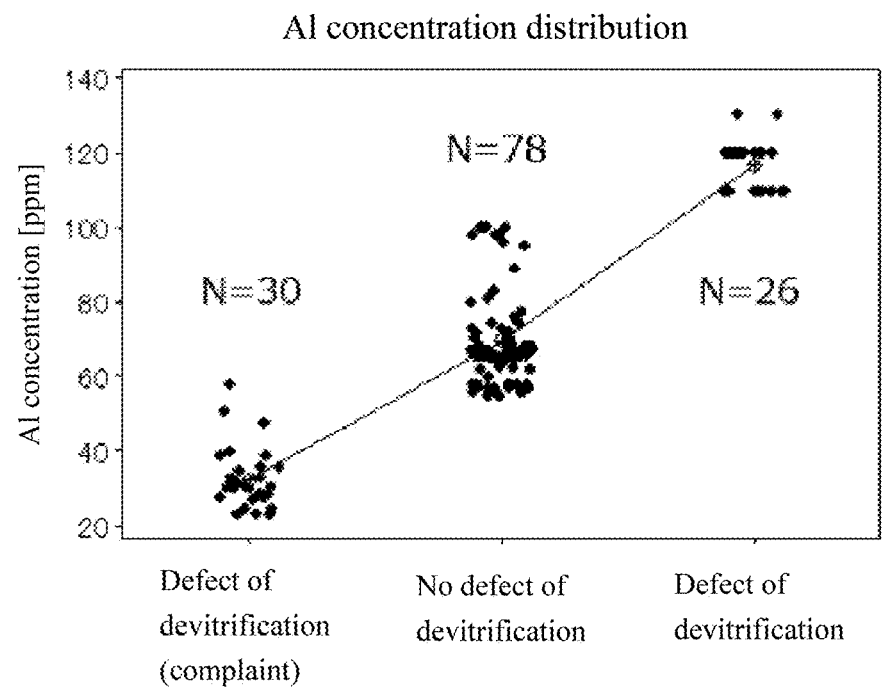
FIG. 1A to FIG. 1D are graphs showing the Al concentration (wt ppm) distributions (FIG. 1A), Ca concentration (wt ppm) distributions (FIG. 1B), Na concentration (wt ppm) distributions (FIG. 1C), and K concentration (wt ppm) distributions (FIG. 1D) in the raw-material silica powders of Example B (indicated in each graph by "defect of devitrification (complaint)"), the raw-material silica powders of Example A (indicated in each graph by "no defect of devitrification"), and the raw-material silica powders of Example C (indicated in each graph by "defect of devitrification").
Figure 1B:
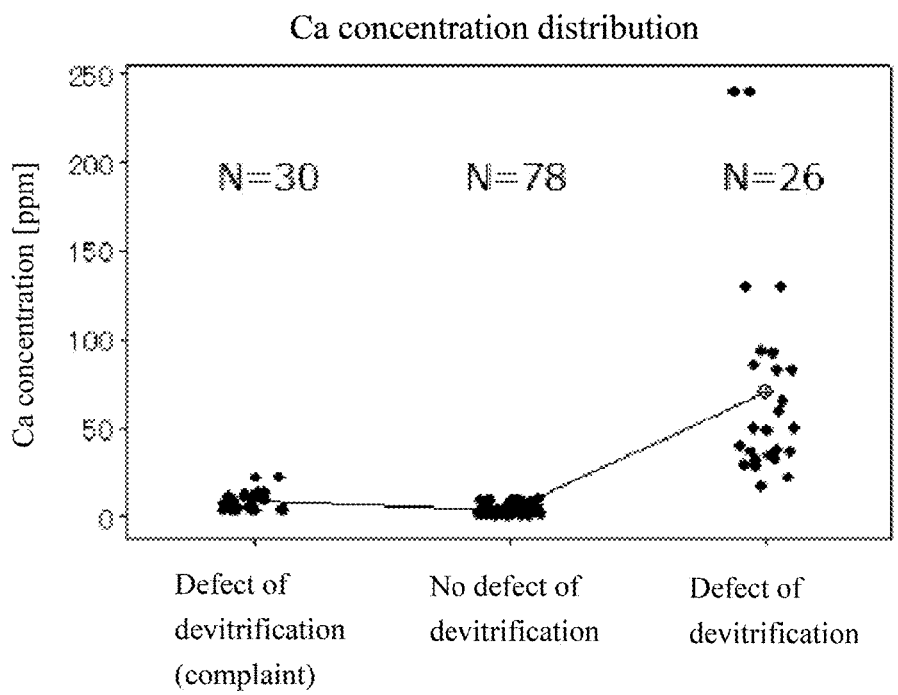
Figure 1C:
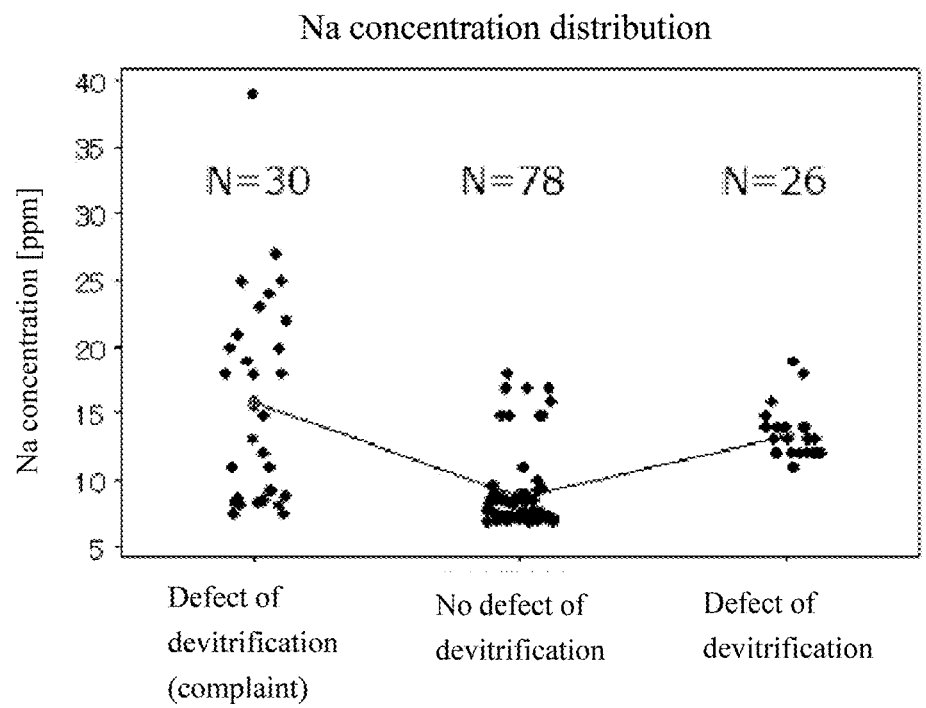
Figure 1D:
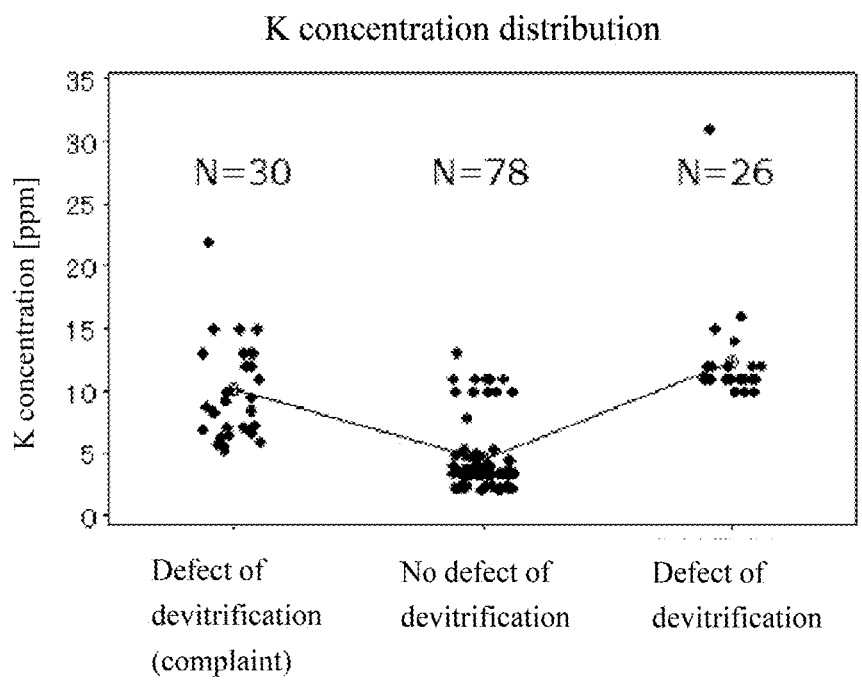

The method of the present invention for producing a silica-glass crucible includes: step 1 in which a raw-material silica powder having a molar concentration ratio (Al/Ca), as calculated from an aluminum (Al) concentration (wt ppm) and a calcium (Ca) concentration (wt ppm) which were determined by a chemical purity analysis, of 15 or higher is charged into a rotating mold and formed; and step 2 in which arc electrodes are inserted into the mold and a layer of the raw-material silica powder accumulated on the inner surface of the mold is arc-melted and vitrified. Namely, the present invention has a feature that the aluminum concentration and calcium concentration in a natural-silica powder to be used as a raw material for forming a silica-glass crucible are regulated to given values. In the case where the silica-glass crucible is to be formed from a natural-silica powder for constituting an outer layer and a synthetic-silica powder for constituting an inner layer, the aluminum concentration and calcium concentration in the natural-silica powder for constituting an outer layer are regulated to the given values.

In step 1, a raw-material silica powder having a molar concentration ratio (Al/Ca), as calculated from an aluminum concentration and a calcium concentration which were determined by a chemical purity analysis, of 15 or higher is selected. Besides having an Al/Ca ratio of 15 or higher, the raw-material silica powder preferably has an aluminum concentration of 55-100 wt ppm and a calcium concentration of 1.2-9.5 wt ppm. The chemical purity analysis specifically is ICP emission spectral analysis.

Al has the function of promoting the crystallization of quartz glass. In cases when Al is contained in the quartz glass in a concentration within that range, the Al interacts with the Ca while attaining an adequate balance therebetween. Consequently, the quartz glass is inhibited from excessively crystallizing and is caused to undergo moderate progress of crystallization. The crucible can hence have improved strength.

Ca has the function of inhibiting the crystallization and serves to appropriately lessen the crystallization-promoting function of the Al in the quartz glass.

Besides containing Al and Ca, the raw-material silica powder contains sodium (Na), potassium (K), lithium (Li), etc. as unavoidable ingredients. These unavoidable ingredients came into the raw-material silica powder in the step of obtaining colloidal silica by reacting metallic silicon (Si) with water in an aqueous solution containing both an alkaline catalyst and a dispersant, among steps for producing the raw-material silica powder. By regulating the molar concentration ratio between Al and Ca (Al/Ca) in the raw-material silica of 15 or higher, the colloidal silica can be made less uneven in viscosity. The alkaline catalyst is, for example, a monovalent-metal hydroxide including Na, K, or Li. The dispersant is an inorganic acid, an organic acid, or a salt (e.g., an Na salt, K salt, Li salt, or ammonium salt) of either. The raw-material silica powder to be used for producing a silica-glass crucible for pulling up single-crystal silicon preferably has an Na concentration less than 0.1 wt ppm, a K concentration less than 0.2 wt ppm, and an Li concentration less than 0.1 wt ppm. The raw-material silica powder to be sued for producing a crucible for melting an optical-glass preferably has an Na concentration less than 15 wt ppm, a K concentration less than 15 wt ppm, and an Li concentration less than 10 wt ppm.

Na, K, and Li all have the function of promoting the crystallization of quartz glass. However, these elements are each an alkali metal which becomes a monovalent cation and have a higher affinity for Si to considerably promote the crystallization as compared with Al, which becomes a trivalent cation. It is hence difficult to control the degree of the crystallization by regulating the concentrations of these elements.

Meanwhile, alkali metals can be serious pollutants for the single-crystal silicon to be pulled up. It is hence preferable that no alkali metals are contained in any material for constituting the crucible, and the alkali metals may be removed by a purification treatment, etc.

In the crystal structure, an Al atom, upon isomorphous replacement of an Si atom, comes into the state of being deficient in positive charge. If a Ca atom is incorporated into this site, the charge of the Al atom is constrained. This atom pair in the charge-constrained state does not serve as a starting point for crystallization.

In case where the Al/Ca molar concentration ratio is too high, specifically, higher than 70, the calcium concentration is relatively low and the proportion in which $Al^{3+}$ ions which have isomorphously replaced $Si^{4+}$ ions come into a charge-constrained state is reduced. The $Al^{3+}$ ions remaining unconstrained are apt to serve as starting points for crystallization. As the Al/Ca molar concentration ratio increases, the number of starting points for crystallization which serve as devitrification nuclei increases and crystallization is promoted. In particular, in case where the Al/Ca molar concentration ratio exceeds 100, cracks may generate especially in the curved bottom portion of the crucible because of a volume change during cooling and even a melt leakage may result. Consequently, by regulating the Al/Ca molar concentration ratio preferably to 70 or less, the amount of Al atoms not in the charge-constrained state can be made small to inhibit the generation of devitrification nuclei, making it possible to maintain the moderate progress of crystallization.

Such an aluminum concentration may be attained by adding, for example, an aqueous solution of aluminum nitrate nonahydrate $(Al(NO_3)_3 \cdot 9H_2O)$ to a raw-material silica powder so as to contain Al in a given amount relative to the calcium concentration therein.

In step 1, a natural-silica powder is charged into a rotating mold and formed by a rotational molding method. In the case of a silica-glass crucible including an outer layer and an inner layer, a natural-silica powder for forming the outer-layer is charged to form a layer with a given thickness and a synthetic-silica powder for forming the inner-layer is then charged on the inner side thereof to form a layer with a given thickness. Use may be made of a method in which after an outer layer has been formed, an inner layer is directly deposited and formed by a flame melting method.

Subsequently, in step 2, arc electrodes are inserted into the rotating mold and the silica-powder layers are arc-melted and vitrified. It is preferable that the arc melting is conducted at a reduced pressure, specifically in a vacuum, under the conditions of preferably about 2,000° C. and a period less than 1 hour.

Through steps 1 and 2, for example, a silica-glass crucible having a wall thickness of 10-30 mm, an outer diameter of 22-36 inches, and a height of 400-900 mm can be obtained.

The silica-glass crucible thus obtained has an aluminum concentration as determined by a chemical purity analysis of 55-100 wt ppm, a calcium concentration as determined by the analysis of 1.2-9.5 wt ppm, and an Al/Ca molar concentration ratio of 15 or higher.

The Al concentration, Ca concentration, Na concentration, and K concentration, and the Al/Na molar concentration ratio, Al/K molar concentration ratio, and Al/Ca molar concentration ratio in the silica-glass crucible are the same as those in the raw-material silica powder.

The method of the present invention for producing a silica-glass crucible is not limited except for the use of a natural-silica powder containing Al and Ca in given amounts as a raw material. Although the crucible is generally produced by a rotational molding method and an arc melting method, the crucible may be produced by other known methods.

The silica-glass crucible according to the present invention is less apt to devitrify, has been moderately crystallized, and retains strength, because of the use of the raw-material silica powder described above. The silica-glass crucible having such properties is for use in pulling up single-crystal silicon or in optical-glass melting, and is inhibited from deforming even when used under high-temperature conditions over a long period. This crucible is hence especially suitable for use in pulling up single-crystal silicon having a large diameter.

Figure 7:
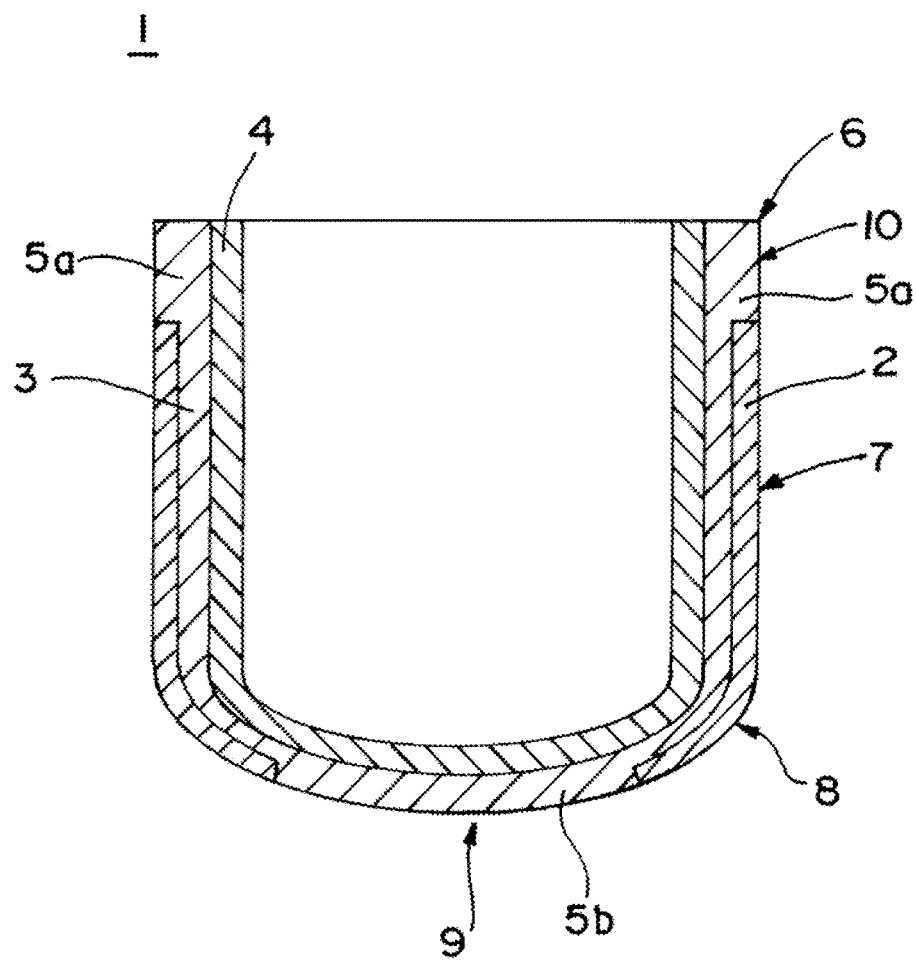
FIG. 7 is a cross-sectional view of a silica-glass crucible according to the present invention.
Figure 8:
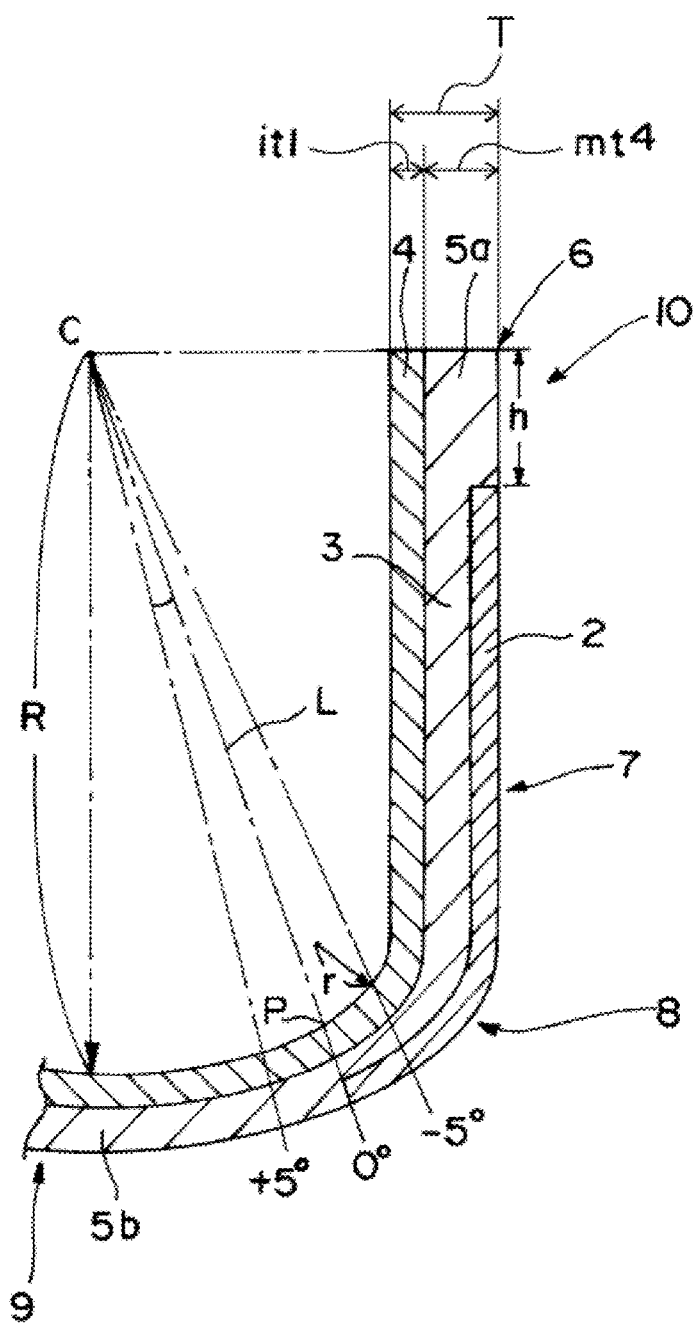
FIG. 8 is an enlarged cross-sectional view of a portion of the silica-glass crucible of FIG. 7.

Examples of embodiments of the silica-glass crucible according to the present invention are explained below by reference to the drawings. FIG. 7 is a cross-sectional view of a silica-glass crucible 1 according to the present invention. FIG. 8 is an enlarged cross-sectional view of a portion of the silica-glass crucible of FIG. 7.

This silica-glass crucible 1 is used, for example, in a single-crystal pulling device (not shown) while being held with a carbon susceptor (not shown) in the device.

Specifically, in the single-crystal pulling device, polycrystalline silicon contained in the silica-glass crucible 1 is melted and single-crystal silicon is pulled out of the silicon melt.

The silica-glass crucible 1 has been formed such that the diameter thereof is, for example, 810 mm (32 inches) and that, as shown in FIG. 7, a portion thereof extending from the upper end 6 of the crucible downward to a given distance (hereinafter that portion is referred to as "crucible upper-end region 10") has a two-layer structure.

Specifically, the crucible upper-end region 10 includes: an opaque outer layer 5a constituted of a layer of natural-material-derived silica glass; and a transparent inner layer 4 which is made of synthetic-material-derived silica glass (or natural-material-derived silica glass) and adjoins the inner surface of the opaque outer layer 5a and which is to be in contact with molten silicon when single-crystal silicon is being pulled up.

The term "opaque" herein means that the silica glass contains a large number of air bubbles therein and is apparently in a clouded state. The term "natural-material-derived silica glass" means silica glass produced by melting natural raw material, e.g., quartz. The term "synthetic-material-derived silica glass" means silica glass produced by melting synthetic raw material synthesized, for example, by hydrolyzing a silicon alkoxide.

Under the crucible upper-end region 10, an outer layer 2 made of crystallization-promoter-containing silica glass has been disposed in the lateral part 7 and down to a given area defined by a curvature change point lying between the bottom part 9 and the bottom corner 8.

The portion where the outer layer 2 has been disposed has a three-layer structure including an opaque interlayer 3, which is an extension of the opaque outer layer 5a and is made of natural-material-derived silica glass, and the transparent inner layer 4.

The bottom part 9 of the crucible has a two-layer structure including an opaque outer layer 5b, which is an extension of the opaque interlayer 3 and is made of natural-material-derived silica glass, and a transparent inner layer 4, which adjoins the opaque outer layer 5b and is made of synthetic-material-derived silica glass (or natural-material-derived silica glass).

More specifically, as shown by the cross-sectional view of FIG. 8, the region extending from the upper end 6 of the crucible downward to a distance h therefrom is the crucible upper-end region 10, which has been formed so as to have a two-layer structure. The distance h is 5 mm or longer but not longer than a distance of the sum of the wall thickness T of the upper end and 10 mm.

The wall thickness T of the upper end is generally 10-18 mm. Because of this, the downward distance h of the crucible upper-end region from the upper end of the crucible is generally 5 mm or longer but not longer than 20-28 mm.

The reasons for this are as follows. Since the thermal expansion of cristobalite is far larger than that of quartz glass, tensile stress is exerted to the outer peripheral surface. In case where the crucible upper-end region 10, which has the two-layer structure, extends downward to less than 5 mm from the upper end 6 of the crucible, cracks generate from the outer peripheral surface around the upper end of the crucible, and it is hence undesirable.

Meanwhile, in case where the crucible upper-end region 10 extends beyond the distance of the sum of the wall thickness of the upper end of the crucible and 10 mm, the crucible upper-end region deforms (becomes inclined) inward, and it is hence undesirable.

The inward deformation of the crucible upper-end region occurs because the transparent inner layer 4 has low viscosity and, hence, force which draws the mouth of the crucible inward is exerted, and because the opaque outer layer 5a contains air bubbles and hence expands more than the transparent inner layer 4 whereby force which deforms the upper end of the crucible inward is exerted (force which renders the upper end inclined inward is exerted).

As FIG. 8 shows, the bottom part 9 inside the crucible has a curvature of radius R (first curvature) and the bottom corner 8 has a curvature of radius r (second curvature). The lateral part 7 of the crucible has been formed linearly along the vertical direction.

The outer layer 2 has been formed from the lower end of the crucible upper-end region 10 downward such that the lower end of the outer layer 2 lies in a given area defined by a curvature changing point P between the bottom part 9 (radius of curvature R) and the bottom corner 8 (radius of curvature r). More specifically, the lower end of the outer layer 2 lies in an area formed by swinging a straight line L over ±5° with respect to the curvature center C of radius R, the straight line L being a line which connects the curvature center C and the curvature change point P, the direction of the straight line L being taken as 0°.

The reasons for this are as follows. In case where the lower end of the outer layer 2 lies in a position larger than +5° when the downward direction (direction toward the bottom part) is taken as positive direction, crystallization (conversion into cristobalite) proceeds rapidly, making it difficult to obtain the desired adhesion between the crucible and the carbon susceptor. There is hence a tendency that the holding of the crucible by the carbon susceptor becomes unstable and the degree of conversion into single-crystal silicon decreases.

Meanwhile, in case where the lower end of the outer layer 2 lies in a position less than −5°, the proportion of the outer layer 2 to the whole crucible is too small and this tends to result in a decrease in resistance to thermal deformation.

Figure 9:
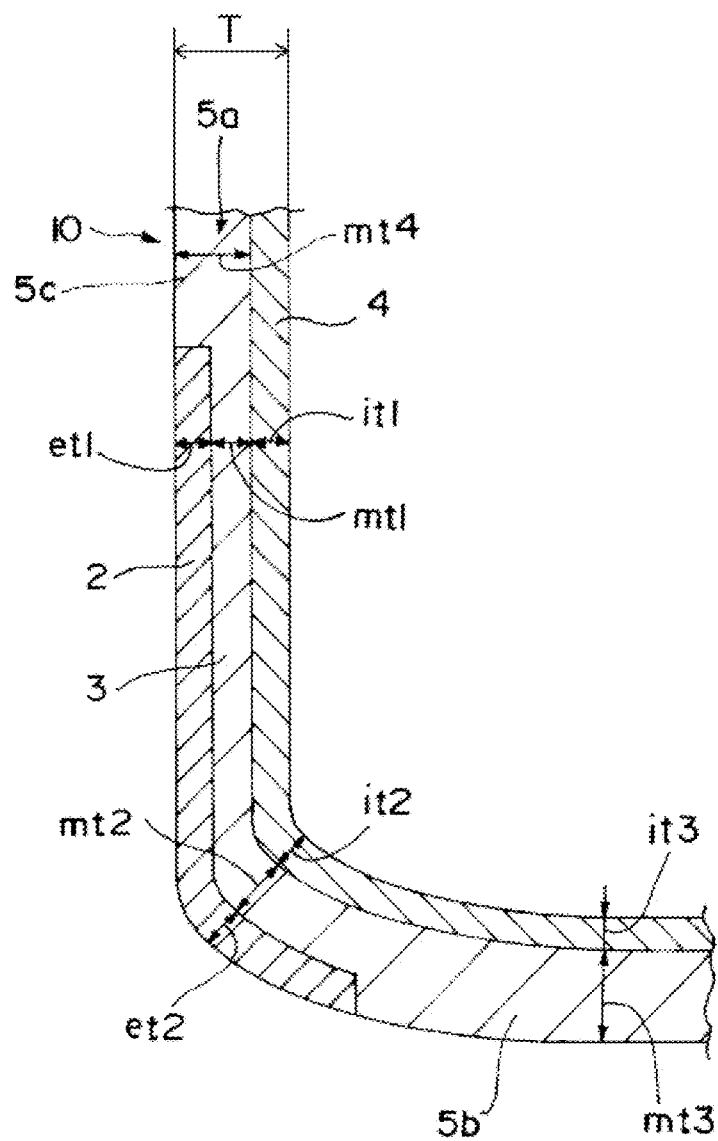
FIG. 9 is an enlarged cross-sectional view of a portion of the silica-glass crucible of FIG. 7, which is for illustrating the thickness dimensions of each layer.

Meanwhile, as FIG. 9 shows, the outer layer 2 is formed such that the thickness dimension et1 in the lateral part 7 of the crucible and the thickness dimension et2 in the bottom corner 8 of the crucible are each 0.5-5 mm (preferably 1-3 mm).

The reasons for this are as follows. In case where the thicknesses thereof are larger than 5 mm, large stress generates due to a difference in thermal expansion between the layers of the wall of the crucible and the stress may cause cracks. In case where the thicknesses thereof are less than 0.5 mm, the resistance to thermal deformation tends to decrease.

The concentration of the crystallization promoter in the outer layer 2 is, for example, 35-100 ppm (preferably 50-80 ppm). The reasons for this are as follows. In case where the concentration of the crystallization promoter is higher than 100 ppm, crystallization is prone to proceed too rapidly and there is a possibility that the crystallization might be completed before the crucible is stably and tightly held by a carbon susceptor.

Meanwhile, in case where the concentration of the crystallization promoter is less than 35 ppm, the rate of crystallization is too low, making it difficult to obtain the desired resistance to thermal deformation.

The opaque interlayer 3 which is made of natural-material-derived silica glass is formed such that, for example, the thickness dimension mt1 in the lateral part 7 of the crucible is 3 mm or larger and the thickness dimension mt2 in the bottom corner 8 of the crucible is 6 mm or larger.

The opaque outer layer 5a in the crucible upper-end region 10 has a thickness dimension mt4, for example, of 10-18 mm, and the opaque outer layer 5b in the bottom part 9 of the crucible has a thickness dimension mt3, for example, of 6 mm or larger.

The reasons for this are as follows. In case where the thickness of the opaque interlayer 3 in the three-layer portion is less than 3 mm, the effect of the opaque interlayer 3 that the crystallization promoter compound is prevented from diffusing is prone to be lessened by irregular flows of arc flames during the melting of silica glass powder and, hence, there is a possibility that some of the crystallization promoter compound contained in the outer layer 2 might pass though the opaque interlayer 3 and come into the transparent inner layer 4, resulting in an increase in crystallization promoter concentration in the transparent inner layer 4.

The reason why the thickness dimension mt4 of the opaque outer layer 5a in the crucible upper-end region 10 is 10-18 mm is that such a thickness is effective in inhibiting heat dissipation through the upper end of the crucible.

In case where the thickness dimension mt2 of the opaque interlayer 3 in the bottom corner 8 of the crucible and the thickness dimension mt3 of the opaque outer layer 5b in the bottom part 9 of the crucible are less than 6 mm, sufficient resistance to thermal deformation is difficult to be obtained. Such thickness dimensions are hence undesirable.

The transparent inner layer 4 is a transparent layer containing substantially no air bubbles and formed by melting synthetic-material-derived silica glass (or natural-material-derived silica glass) including Na, K, and Al metal impurity contents of 1 ppm or less each.

The transparent inner layer 4 has been formed such that the thickness dimension it1 thereof in the crucible upper-end region 10 and lateral part 7 of the crucible, the thickness dimension it2 thereof in the bottom corner 8 of the crucible, and the thickness dimension it3 thereof in the bottom part 9 of the crucible are each 3 mm or larger.

This is because in case where the thickness of the transparent inner layer 4 is less than 3 mm, it is difficult to regulate the crystallization-promoter concentration in the inner surface of the transparent inner layer 4, which comes into contact with molten silicon, to a sufficiently low value, e.g., 1 ppm or less.

The embodiment explained above is a crucible having a three-layer structure including an outer layer 2 made of crystallization-promoter-containing silica glass, an opaque interlayer 3, and a transparent inner layer 4.

However, the configuration of the present invention is not limited thereto. For example, the crucible of the present invention may be a crucible having a four-layer structure including, from the inside of the crucible, a transparent inner layer 4, an opaque interlayer 3, a first outer layer, which is made of silica glass containing no crystallization promoter, and a second outer layer disposed on the outer side of the first outer layer of silica glass, the second outer layer being made of crystallization-promoter-containing silica glass.

In this configuration, the first outer layer is formed up to the upper end 6 of the crucible, while the second outer layer is formed up to the lower end of a region which extends from the upper end 6 of the crucible downward to a distance therefrom of 5 mm or longer but not longer than the distance of sum of the upper-end wall thickness and 10 mm.

Next, a method for producing a silica-glass crucible 1 having the structure described above is explained.

Figure 10:
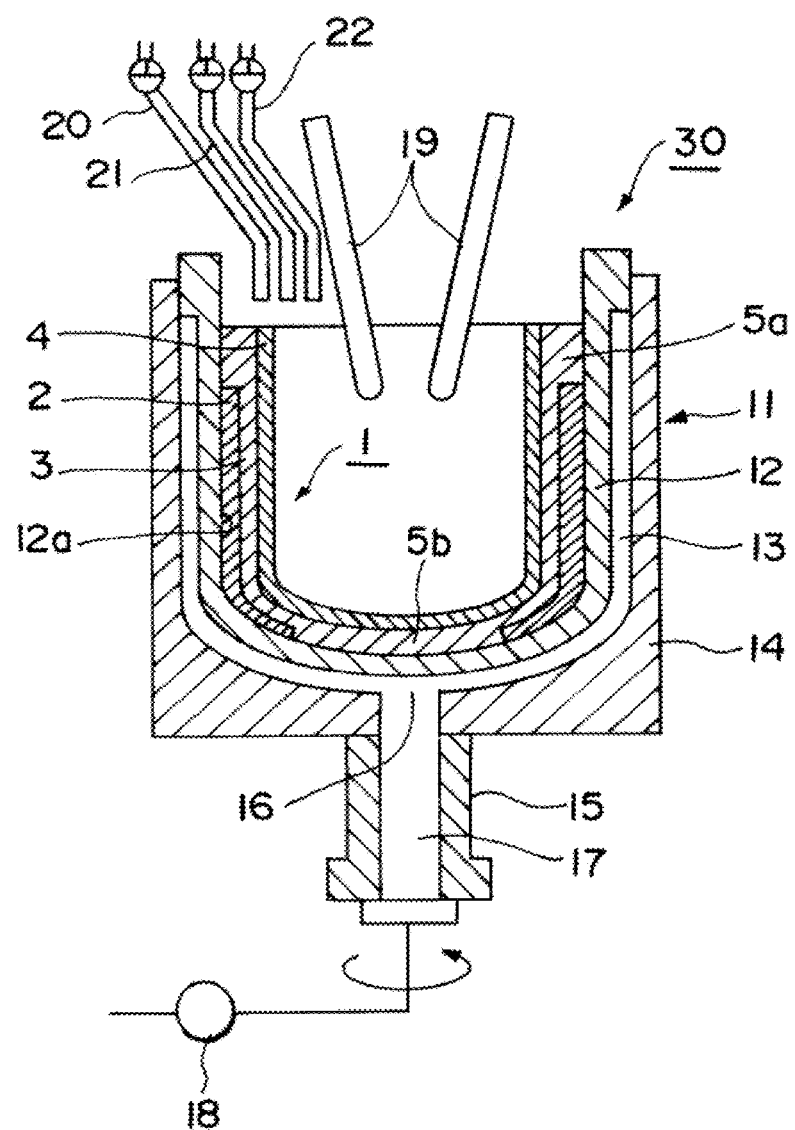
FIG. 10 is a cross-sectional view of a silica-glass crucible production device for producing the silica-glass crucible of FIG. 7.

The silica-glass crucible production device 30 shown in FIG. 10 is used to produce the silica-glass crucible 1. The silica-glass crucible production device 30 includes a crucible-forming mold 11 including: an inside member 12 constituted of a gas-permeable member such as, for example, a mold having a plurality of through holes formed therein or a porous carbon mold to which highly purification treatment has been performed; and a holder 14 which holds the inside member 12, the holder including a aeration part 13 surrounding the inside member 12.

A rotating shaft 15, which is connected to a rotating means (not shown), is firmly fixed to a lower portion of the holder 14 to rotatably support the crucible-forming mold 11. The aeration part 13 communicates with a gas discharge channel 17 formed in the center of the rotating shaft 15, via an opening 16 formed in the lower portion of the holder 14. The gas discharge channel 17 is connected to a depressurization mechanism 18.

In an upper area facing the inside member 12 have been disposed: arc electrodes 19 for arc discharge; a feed nozzle 20 for crystallization-promoter-containing silica glass; a feed nozzle 21 for natural-material-derived silica glass; and a feed nozzle 22 for synthetic-material-derived silica glass.

A powder of crystallization-promoter-containing silica glass to be used for forming the outer layer 2 is obtained in the following manner. For example, in the case where the crystallization promoter is Al, the nitrate of Al ($Al(NO_3)_3$) is dissolved in water in such an amount as to result in a silica glass powder having an aluminum concentration of 35-100 ppm. The aqueous $Al(NO_3)_3$ solution thus produced is added to a powder of natural-material-derived silica glass, and the mixture is stirred. The silica glass powder immersed in the aqueous $Al(NO_3)_3$ solution is heat-treated at 800-1,100° C. for dehydration and acid removal.

In the case of using Mg, Ca, etc. as the crystallization promoter, the desired powder is obtained likewise by adding an aqueous solution of the nitrate to a powder of natural-material-derived silica glass, and stirring and heat-treating the mixture.

In the case of adding Al and Ca as the crystallization promoter, it is desirable that the aluminum concentration and calcium concentration in the crystallization-promoter-containing silica glass are 9-20 wt ppm and 0.1-0.6 wt ppm, respectively, and that the molar concentration ratio between Al and Ca (Al/Ca) is $15 \leq Al/Ca \leq 200$.

The addition of the crystallization promoter renders the silica glass powder less uneven in viscosity, resulting in a silica-glass crucible in which cracks are inhibited from generating from the upper end of the crucible and the upper-end region is inhibited from deforming (becoming inclined) inward.

The Al-containing silica-glass powder thus obtained is used in producing a silica-glass crucible 1 using the silica-glass crucible production device 30 described above, in the following manner. A rotating driving device (not shown) is operated to rotate the rotating shaft 15 in the direction indicated by the arrow, thereby rotating the crucible-forming mold 11 at a high speed.

Next, the Al-containing silica-glass powder obtained above is fed to the inside of the crucible-forming mold 11 through the feed nozzle 20 for crystallization-promoter-containing silica glass. The Al-containing silica glass powder fed is pushed by centrifugal force against the inner surface of the inside member 12 to form an outer layer 2.

The positions of the upper and lower ends of this outer layer 2 are determined as explained above using FIG. 8, and the unnecessary upper and lower portions of the outer layer 2 are removed.

Subsequently, a powder of natural-material-derived silica glass is fed through the feed nozzle 21 for natural-material-derived silica glass such that an opaque interlayer 3 and opaque outer layers 5a and 5b are formed, in a thickness of 3 mm or larger on the inside of the outer layer 2 which is made of an Al-containing silica-glass layer, in a thickness of 3 mm or larger in the crucible upper-end region, and in a thickness of 6 mm or larger in the bottom corner and bottom part.

The natural-material-derived silica glass powder fed is pushed by centrifugal force against the inside surface of the outer layer 2 and against the inside member 12 to form the shapes of an opaque interlayer 3 and opaque outer layers 5a and 5b.

Next, a powder of synthetic-material-derived silica glass (or a powder of natural-material-derived silica glass) including Na, K, and Al metal impurity contents of 1 ppm or less each is fed through the feed nozzle 22 for synthetic-material-derived silica glass such that a transparent layer having a thickness of 3 mm or larger is formed on the inner side of the opaque interlayer 3 and opaque outer layers 5a and 5b.

The synthetic-material-derived silica glass powder fed is pushed by centrifugal force against the inside surface of the opaque interlayer 3 and opaque outer layers 5a and 5b to form the shape of a transparent inner layer 4.

Thus, a crucible-shaped object including an outer layer 2, an opaque interlayer 3, opaque outer layers 5a and 5b, and a transparent inner layer 4 is obtained, in which the aluminum concentration decreases in stages.

Furthermore, the depressurization mechanism 18 is operated to depressurize the inside of the inside member 12 and electricity is applied between the arc electrodes 19 to heat the crucible-shaped object from inside, thereby melting the transparent inner layer 4, opaque interlayer 3, opaque outer layers 5a and 5b, and outer layer 2 of the crucible-shaped object. Thus, a silica-glass crucible 1 is produced.

According to the embodiment described above, a silica-glass crucible 1 is produced such that the crucible has a crucible upper-end region 10 which extends from the upper end of the crucible downward to a distance therefrom of 5 mm or longer but not longer than the distance of sum of upper-end wall thickness and 10 mm, and that the crucible upper-end region 10 has a two-layer structure including an opaque outer layer 5a made of natural-material-derived silica glass and a transparent inner layer 4 made of natural-material-derived silica glass or synthetic-material-derived silica glass.

Because of this, not only cracks can be inhibited from generating from around the opening of the crucible (from the upper end of the crucible) but also the crucible upper-end region can be inhibited from deforming (becoming inclined) inward. This crucible hence can have improved durability, and an improvement in the degree of conversion into single crystal can be attained. Furthermore, the problem that single-crystal silicon has a defect of crystal quality due to the inward deformation (inclination) of the crucible upper-end region can be eliminated.

In this silica-glass crucible 1, a given region of the bottom part 9 (opaque outer layer 5b) where the outer layer 2 made of crystallization-promoter-containing silica glass is not present softens in the initial stage of initiation of the pulling of single-crystal silicon and comes into close contact with the carbon susceptor which holds the silica-glass crucible 1. Thereafter, over the period from initiation of the pulling to completion thereof, the crystallization (conversion into cristobalite) of the outer layer 2 lying in a given range including the bottom corner 8 and the lateral part 7 proceeds owing to heating at a high temperature to improve the stability of close contact between the entire silica-glass crucible 1 and the carbon susceptor holding the silica-glass crucible 1. In addition, the crystallization improves the resistance to thermal deformation.

Consequently, stable holding by close contact with the carbon susceptor is obtained while ensuring the resistance of the silica-glass crucible 1 to thermal deformation, making it possible to improve the degree of conversion into single-crystal silicon.

EXAMPLES

The present invention is explained below in detail by reference to an Example, but the invention is not construed as being limited by the following Example.

Example A

Figure 2A:
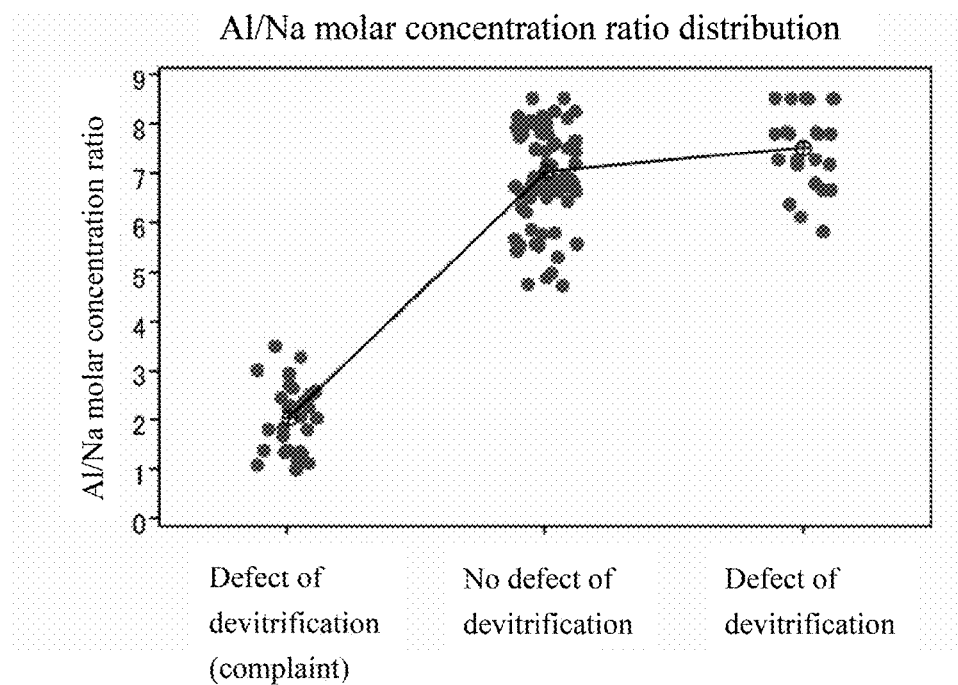
FIG. 2A to FIG. 2C are graphs showing Al/Na molar concentration ratio distributions (FIG. 2A), Al/K molar concentration ratio distributions (FIG. 2B), and Al/Ca molar concentration ratio distributions (FIG. 2C) which are based on the results in FIG. 1A to FIG. 1D.
Figure 2B:
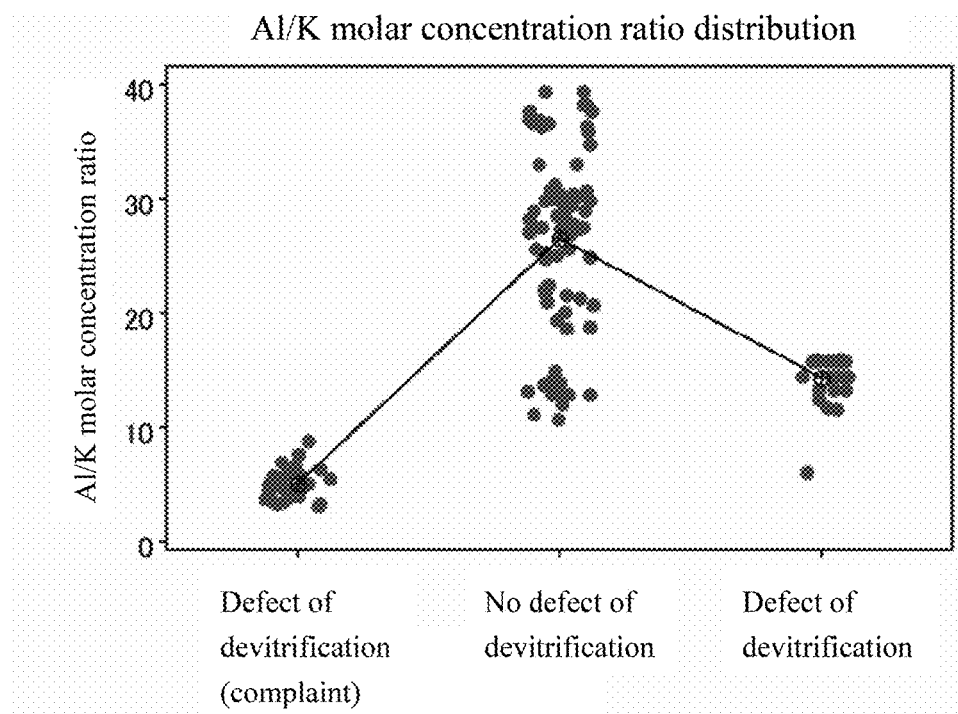
Figure 2C:
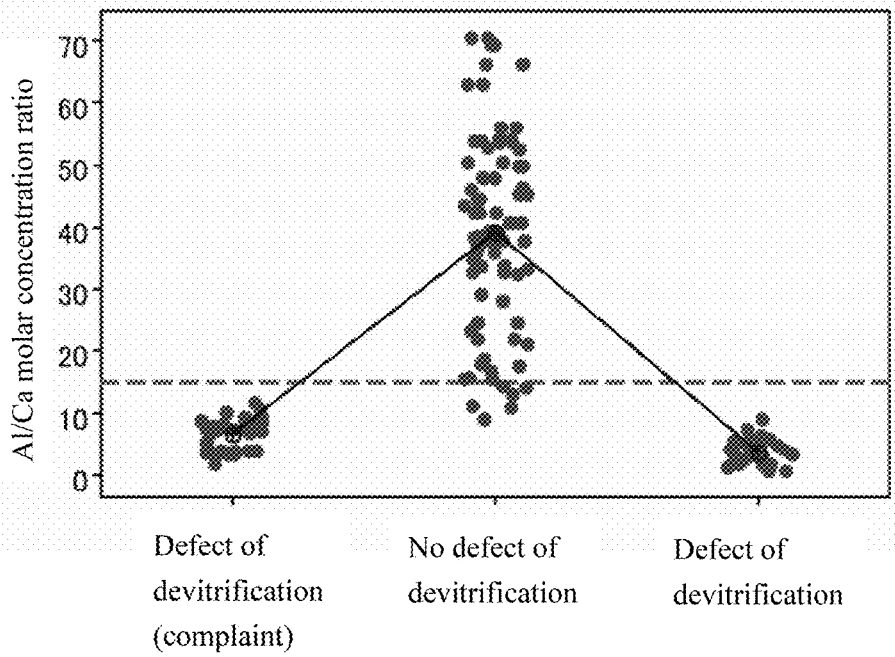
Figure 3A:
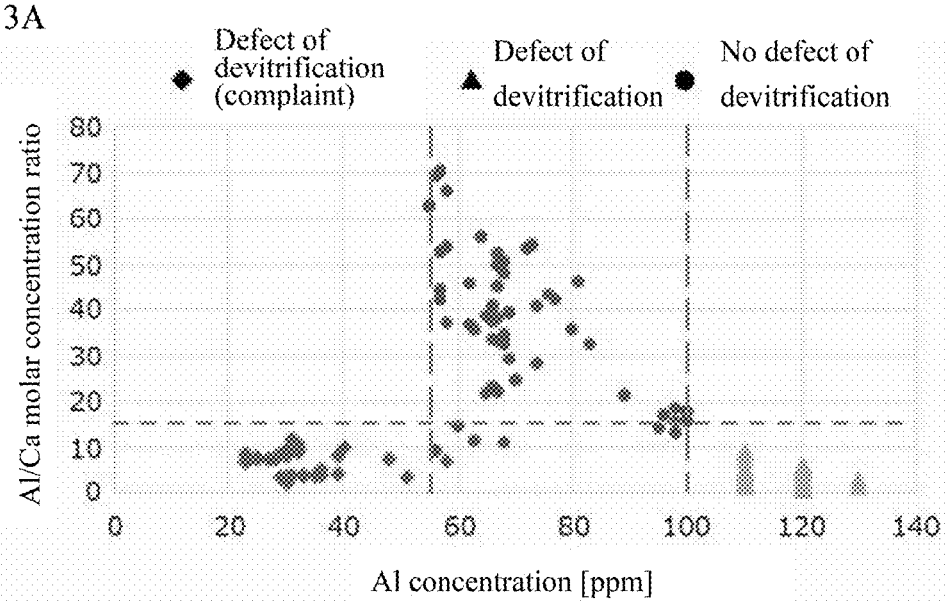
FIG. 3A to FIG. 3C are: a graph (FIG. 3A) showing a correlation between Al concentration (wt ppm) and Al/Ca molar concentration ratio which is based on FIG. 1A and FIG. 2C; a graph (FIG. 3B) showing a correlation between Ca concentration (wt ppm) and Al/Ca molar concentration ratio which is based on FIG. 1B and FIG. 2C; and a graph (FIG. 3C) which is an enlargement of the graph of FIG. 3B.
Figure 3B:
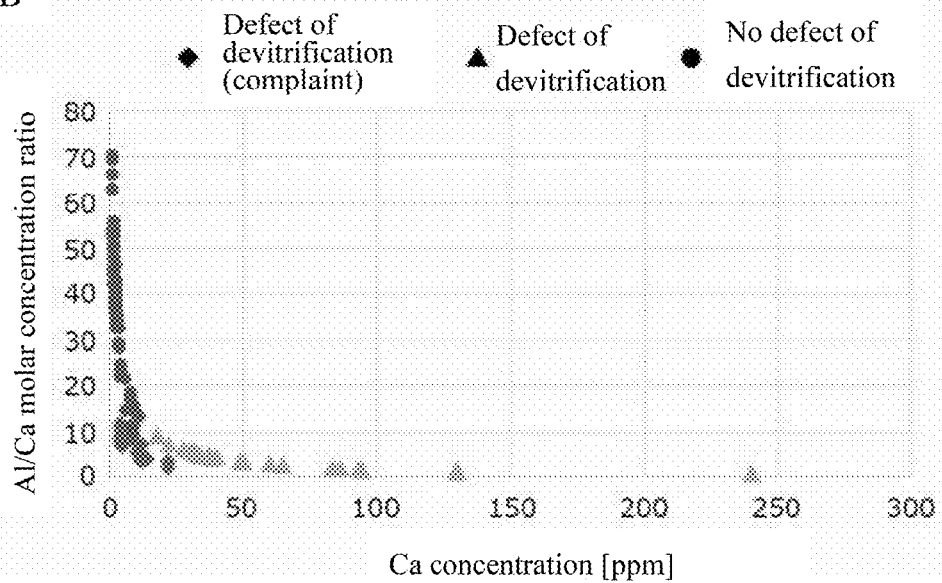
Figure 3C:
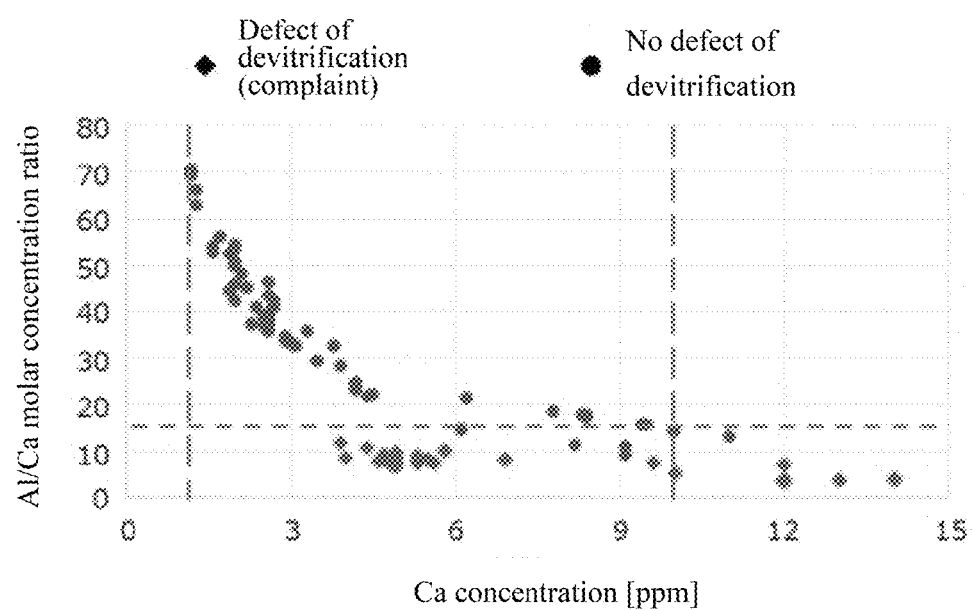

Use was made of 78 batches of raw-material silica powders (N=78) which included the following inorganic-ingredient contents determined by ICP analysis: Al concentrations, 55-100 wt ppm; Ca concentrations, 1.2-9.5 wt ppm; Na concentrations, 6.9-18 wt ppm; and K concentrations, 2.1-13 wt ppm (FIG. A to FIG. 1D). In FIG. 2A to FIG. 2C are shown an Al/Na molar concentration ratio distribution (FIG. 2A), an Al/K molar concentration ratio distribution (FIG. 2B), and an Al/Ca molar concentration ratio distribution (FIG. 2C) which are based on the results in FIG. 1A to FIG. 1D. FIG. 3A to FIG. 3C show a correlation between Al concentration and Al/Ca molar concentration ratio (FIG. 3A) and a correlation between Ca concentration and Al/Ca molar concentration ratio (FIG. 3B), which are based on the results given in FIG. 2C, and further show a graph (FIG. 3C) which is an enlargement of the graph of FIG. 3B. In the graphs of FIG. 1A to FIG. 1D, FIG. 2A to FIG. 2C, and FIG. 3A to FIG. 3C, the samples of Example A are ones indicated by "no defect of devitrification".

As FIG. 3A shows, plotting is dense in a region where the Al concentration is 55-100 wt ppm and the Al/Ca molar concentration ratio is 15 or higher. The results indicate that production of a silica-glass crucible that is less apt to devitrify is rendered possible by selecting a raw-material silica powder having an Al concentration and an Al/Ca molar concentration ratio which are within that region.

Subsequently, a raw-material silica powder having an Al/Ca molar concentration ratio of 42.34 was selected from among those raw-material silica powders, and the raw-material silica powder (Al/Ca molar concentration ratio=42.34) was charged into a rotating crucible-forming mold in a given thickness and formed by a rotational molding method. Arc electrodes were then inserted into the crucible-forming mold to vitrify the raw-material silica powder by vacuum arc melting under the conditions of about 2,000° C. and a period less than 1 hour, thereby producing a silica-glass crucible having a wall thickness of 30 mm, an outer diameter of 28 inches, and a height of 665 mm.

Figure 6:
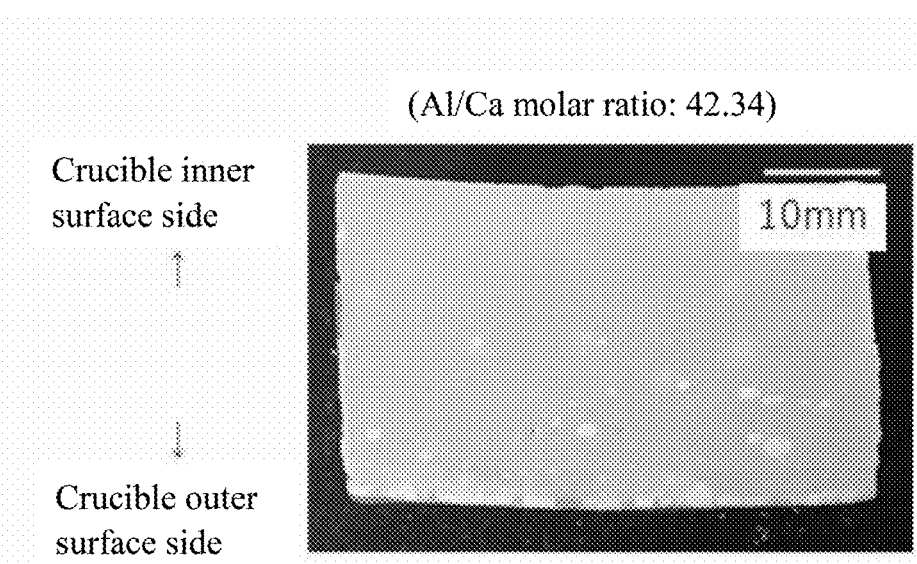
FIG. 6 is a photograph showing the devitrified state of a test piece (Al/Ca molar concentration ratio, 42.34) prepared by heat-treating the silica-glass crucible of Example A at 1,500° C. for 100 hours and then destroying the crucible.

A test piece having dimensions of 45 mm×30 mm×20 mm (thickness) was cut out of the silica-glass crucible and heat-treated in the air at 1,500° C. for 100 hours. The heat-treated test piece was visually examined for devitrified spots due to the heat treatment to evaluate the crystallization. As FIG. 6 shows, several devitrified spots were observed but the crucible as a whole was found to have been less apt to devitrify.

The silica-glass crucible included the following inorganic-ingredient contents: an Al concentration of 55-100 wt ppm, a Ca concentration of 1.2-9.5 wt ppm, an Na concentration of 6.9-18 wt ppm, and a K concentration of 2.1-13 wt ppm, these inorganic-ingredient contents being the same as in the raw-material silica powder.

Example B

Use was made of 30 batches of raw-material silica powders (N=30) which included the following inorganic-ingredient contents determined by ICP analysis: Al concentrations, 23-58 wt ppm; Ca concentrations, 3.9-38 wt ppm; Na concentrations, 7.5-39 wt ppm; and K concentrations, 5.2-22 wt ppm (FIG. 1A to FIG. 1D). Namely, raw-material silica powders each having an Al/Ca molar concentration ratio less than 15 were used in Example B.

In FIG. 2A to FIG. 2C are shown an Al/Na molar concentration ratio distribution (FIG. 2A), an Al/K molar concentration ratio distribution (FIG. 2B), and an Al/Ca molar concentration ratio distribution (FIG. 2C) which are based on the results in FIG. 1A to FIG. 1D. FIG. 3A to FIG. 3C show a correlation between Al concentration and Al/Ca molar concentration ratio (FIG. 3A) and a correlation between Ca concentration and Al/Ca molar concentration ratio (FIG. 3B), which are based on the results given in FIG. 2C, and further show a graph (FIG. 3C) which is an enlargement of the graph of FIG. 3B. In the graphs of FIG. 1A to FIG. 1D, FIG. 2A to FIG. 2C, and FIG. 3A to FG. 3C, the samples of Example B are ones indicated by "defect of devitrification (complaint)".

A raw-material silica powder having an Al/Ca molar concentration ratio of 7.43 was selected from among those raw-material silica powders, and a silica-glass crucible was produced in the same manner as in Example A.

Figure 4:
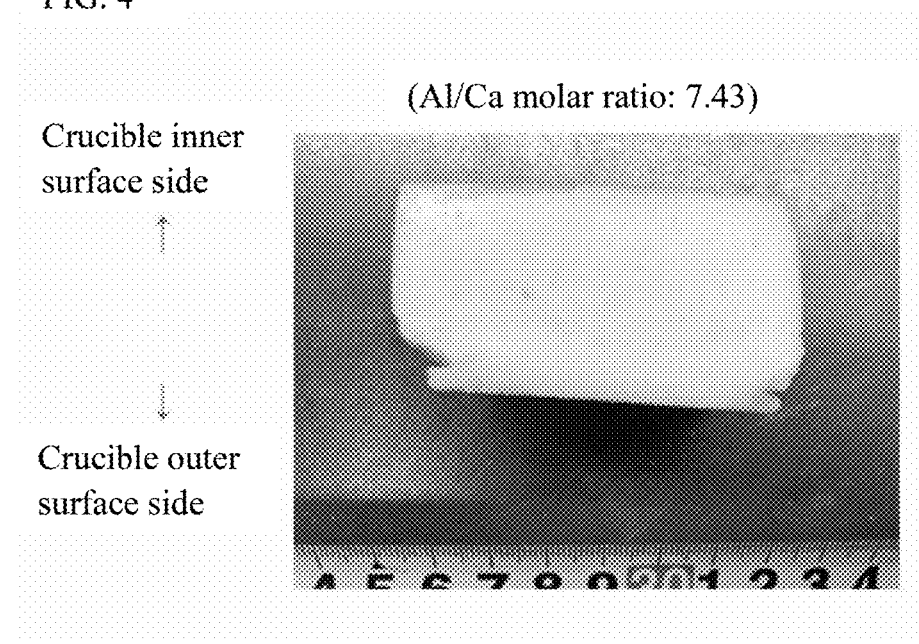
FIG. 4 is a photograph showing the devitrified state of a test piece (Al/Ca molar concentration ratio, 7.43) prepared by heat-treating the silica-glass crucible of Example B at 1,500° C. for 100 hours and then destroying the crucible.

The silica-glass crucible obtained had suffered defect of devitrification due to cracks, etc. Subsequently, a test piece having dimensions of 45 mm×30 mm×20 mm (thickness) was cut out of the silica-glass crucible and heat-treated in the air at 1,500° C. for 100 hours. The heat-treated test piece was visually examined for devitrified spots due to the heat treatment to evaluate the crystallization. As FIG. 4 shows, the test piece had wholly become clouded and was found to have suffered defect of devitrification.

Example C

Use was made of 26 batches of raw-material silica powders (N=26) which included the following inorganic-ingredient contents determined by ICP analysis: Al concentrations, 110-130 wt ppm; Ca concentrations, 18-240 wt ppm; Na concentrations, 11-19 wt ppm; and K concentrations, 10-31 wt ppm (FIG. 1A to FIG. 1D). Namely, raw-material silica powders each having a Ca concentration which was abnormally high for the Al concentration were used in Example C.

In FIG. 2A to FIG. 2C are shown an Al/Na molar concentration ratio distribution (FIG. 2A), an Al/K molar concentration ratio distribution (FIG. 2B), and an Al/Ca molar concentration ratio distribution (FIG. 2C) which are based on the results in FIG. 1A to FIG. 1D. FIG. 3A to FIG. 3C show a correlation between Al concentration and Al/Ca molar concentration ratio (FIG. 3A) and a correlation between Ca concentration and Al/Ca molar concentration ratio (FIG. 3B), which are based on the results given in FIG. 2C, and further show a graph (FIG. 3C) which is an enlargement of the graph of FIG. 3B. In the graphs of FIG. 1A to FIG. 1D, FIG. 2A to FIG. 2C, and FIG. 3A to FIG. 3C, the samples of Example C are ones indicated by "defect of devitrification".

A raw-material silica powder having an Al/Ca molar concentration ratio of 2.44 was selected from among those raw-material silica powders, and a silica-glass crucible was produced in the same manner as in Example A.

The silica-glass crucible obtained had suffered defect of devitrification due to cracks, etc.

A test piece having dimensions of 45 mm×30 mm×20 mm (thickness) was cut out of the silica-glass crucible and heat-treated in the air at 1,500° C. for 100 hours. The heat-treated test piece was visually examined for devitrified spots due to the heat treatment to evaluate the crystallization. As FIG. 5 shows, the test piece had wholly become clouded and was found to have suffered defect of devitrification.

Figure 5:
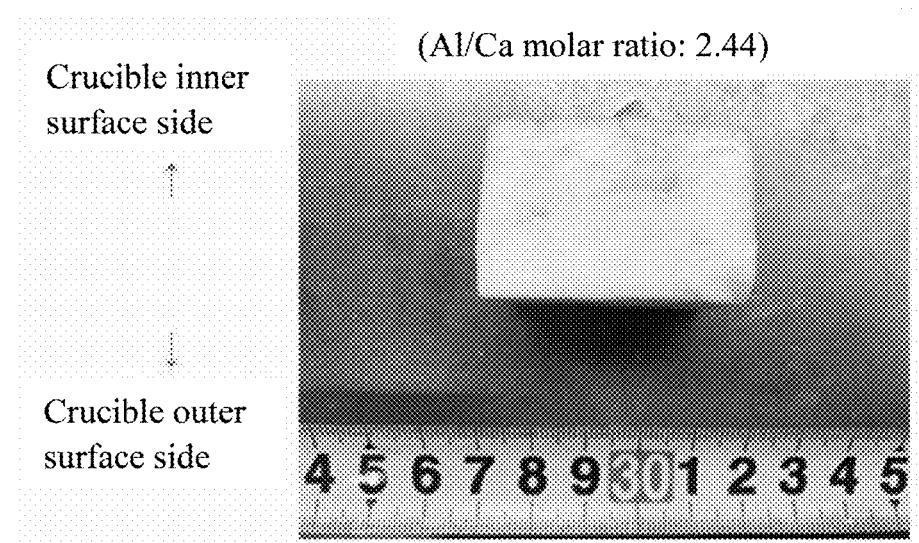
FIG. 5 is a photograph showing the devitrified state of a test piece (Al/Ca molar concentration ratio, 2.44) prepared by heat-treating the silica-glass crucible of Example C at 1,500° C. for 100 hours and then destroying the crucible.

As FIG. 4 and FIG. 5 show, no tendency common among the silica-glass crucibles which had suffered defect of devitrification was found with respect to the Al concentrations, Ca concentrations, or chemical analysis values of the other inorganic ingredients in the raw materials which had been used therefor. However, with respect to the molar concentration ratio between Al and an alkali element (K, Na, or Ca) (FIG. 2A to FIG. 2C), a tendency that the each raw materials used for the crucibles having defect of devitrification had an Al/Ca molar concentration ratio of less than 15 was ascertained, as shown in FIG. 2C. It is hence thought that selecting a raw-material silica powder having an Al/Ca molar concentration ratio of 15 or higher makes it possible to produce a silica-glass crucible inhibited from having a defect of devitrification. Furthermore, the results were examined for any correlation between Al or Ca concentration and Al/Ca molar concentration ratio. As a result, it was found as shown in FIG. 3A to FIG. 3C that use of raw-material silica powders having an Al concentration of 55-100 wt ppm (FIG. 3A) and a Ca concentration of 1.2-9.5 wt ppm (FIG. 3B) had given good results.

The silica-glass crucible according to the present invention is further explained below by reference to Examples which are different form the above described Examples. In the following Examples, silica-glass crucibles each including a configuration shown in the embodiments described above were used to conduct pulling of single-crystal silicon. Each silica-glass crucible used was examined for the degree of crystallization (yield) in obtained single-crystal silicon and for the amount of deformation of the opening upper end of the crucible.

(Experiment 1)

In Experiment 1, a 32-inch-crucible production apparatus was used to produce silica-glass crucibles while changing, as a factor, the area where the crucible upper-end region 10 according to the embodiment was to be formed. Each silica-glass crucible produced was used to conduct single-crystal pulling.

Specifically, the crucible upper-end region having a two-layer structure was set such that the region extended from the upper end of the crucible downward to a distance therefrom of 50 mm (Example 1-1), 45 mm (Example 1-2), 40 mm (Example 1-3), 35 mm (Example 1-4), 30 mm (Example 1-5), 25 mm (Example 1-6), 20 mm (Example 1-7), 15 mm (Example 1-8), 10 mm (Example 1-9), 5 mm (Example 1-10), or 0 mm (Example 1-11).

The thickness dimensions of the layers of each silica-glass crucible thus produced were as follows.

With reference to FIG. 9, the transparent inner layer 4 had the thickness dimension it1 of 3 mm, the thickness dimension it2 of 7 mm, and the thickness dimension it3 of 3 mm.

The opaque outer layer 5a had a thickness dimension mt4 of 12 mm, a thickness dimension mt2 of 17 mm, and a thickness dimension mt3 of 12 mm. The outer layer 2 had a thickness dimension et1 of 1 mm and a thickness dimension et2 of 1 mm. The sum T of the thickness dimension it1 of the opening upper end of the crucible and mt4 was 15 mm.

With reference to FIG. 8, the curvature of radius R (first curvature) of the bottom part 9 was 813 mm and the curvature of radius r (second curvature) of the bottom corner 8 was 160 mm. The outer layer 2 was formed such that the lower end of the outer layer 2 was in an area formed by swinging a straight line L over ±+5 with respect to the curvature center C of radius R, the straight line L being a line which connected the curvature center C and the curvature change point P, the direction of the straight line L being taken as 0°.

Furthermore, the concentration of a crystallization promoter in the outer layer 2 was set at 50 ppm.

The conditions for pulling up single-crystal silicon were as follows.

The pulling of single-crystal silicon was conducted in the following manner. Blocks of polycrystalline silicon as a raw material were introduced into the silica-glass crucible and held in an inert gas atmosphere under an argon gas atmosphere of 10-200 Torr. The contents were heated from room temperature to a pulling temperature of 1,400-1,550° C. over 5-25 hours and held at this temperature for 10 hours to melt the polycrystalline-silicon blocks and obtain a silicon melt. A seed crystal (single-crystal silicon) was immersed in the silicon melt (necking step) and then gradually pulled up while rotating the crucible. Thus, single-crystal silicon was grown using the seed crystal as a nucleus.

The conditions and experimental results of each of the Examples 1-1 to 1-11 in Experiment 1 are shown in Table 1.

In Table 1, the deformation amount indicates the amount in which the upper end of each crucible became inclined inward. The yield indicates the degree of conversion into single crystal. In the remarks, each crucible in which the pulling of single-crystal silicon was unable to be continued is indicated by "unacceptable"; each crucible in which the pulling of single-crystal silicon was able to be continued is indicated by "acceptable"; and each crucible which cracked to make the pulling of single-crystal silicon unable to be continued is indicated by "cracked".

TABLE 1

| Position of outermost-layer upper end (mm) | Deformation amount (mm) | Remarks | Yield (%) |
|---|---|---|---|
| 50 | 34 | unacceptable | 0 |
| 45 | 25 | unacceptable | 30 |
| 40 | 19 | unacceptable | 57 |
| 35 | 15 | unacceptable | 73 |
| 30 | 8 | unacceptable | 82 |
| 25 | 4 | acceptable | 100 |
| 20 | 2 | acceptable | 100 |
| 15 | 0 | acceptable | 100 |
| 10 | 0 | acceptable | 100 |
| 5 | 0 | acceptable | 100 |
| 0 | 0 | cracked | 0 |

It was ascertained from the results in Table 1 that crack generation from around the opening of the crucible (from the upper end of the crucible) and the inward deformation (inclination) of the upper-end region of the crucible were able to be inhibited in cases when the upper end of the outermost layer was in the range of 5-25 mm, i.e., in a region extending from the upper end of the crucible downward to a distance therefrom of 5 mm or longer but not longer than the distance of sum (25 mm) of the wall thickness of 15 mm of the upper end and 10 mm.

Furthermore, it is possible to attain improvements in crucible durability and the degree of conversion into single crystal and to overcome the problem that single-crystal silicon has a defect of crystal quality due to the inward deformation (inclination) of the crucible upper-end region.

(Experiment 2)

Using a 22-inch-crucible production apparatus, silica-glass crucibles were produced in the same manner as in Experiment 1. Each silica-glass crucible produced was used to conduct single-crystal pulling.

Specifically, the crucible upper-end region, which had a two-layer structure, was set such that the region extended from the upper end of the crucible downward to a distance therefrom of 50 mm (Example 2-1), 45 mm (Example 2-2), 40 mm (Example 2-3), 35 mm (Example 2-4), 30 mm (Example 2-5), 25 mm (Example 2-6), 20 mm (Example 2-7), 15 mm (Example 2-8), 10 mm (Example 2-9), 5 mm (Example 2-10), or 0 mm (Example 2-11).

The thickness dimensions of the layers of each silica-glass crucible thus produced were as follows.

With reference to FIG. 9, the transparent inner layer 4 had the thickness dimension it1 of 3 mm, the thickness dimension it2 of 7 mm, and the thickness dimension it3 of 3 mm.

The opaque outer layer 5a had a thickness dimension mt4 of 10 mm, a thickness dimension mt2 of 16 mm, and a thickness dimension mt3 of 9 mm. The outer layer 2 has a thickness dimension et1 of 1 mm and a thickness dimension et2 of 1 mm. The sum T of the thickness dimension it1 of the opening upper end of the crucible and mt4 was 13 mm.

With reference to FIG. 2, the curvature of radius R (first curvature) of the bottom part 9 was 813 mm, and the curvature of radius r (second curvature) of the bottom corner 8 was 160 mm. The outer layer 2 was formed such that the lower end of the outer layer 2 was in an area formed by swinging a straight line L over ±5° with respect to the curvature center C of radius R, the straight line L being a line which connected the curvature center C and the curvature change point P, the direction of the straight line L being taken as 0°.

Furthermore, the concentration of a crystallization promoter in the outer layer 2 was set at 50 ppm.

The conditions for pulling up single-crystal silicon were the same as in Experiment 1.

The conditions and experimental results of each of the Examples 2-1 to 2-11 in Experiment 2 are shown in Table 2.

In Table 2, the deformation amount indicates the amount in which the upper end of each crucible became inclined inward. The yield indicates the degree of conversion into single crystal. In the remarks, each crucible in which the pulling of single-crystal silicon was unable to be continued is indicated by "unacceptable"; each crucible in which the pulling of single-crystal silicon was able to be continued is indicated by "acceptable"; and each crucible which cracked to make the pulling of single-crystal silicon unable to be continued is indicated by "cracked".

TABLE 2

| Position of outermost-layer upper end (mm) | Deformation amount (mm) | Remarks | Yield (%) |
|---|---|---|---|
| 50 | 23 | unacceptable | 0 |
| 45 | 18 | unacceptable | 28 |
| 40 | 15 | unacceptable | 49 |

TABLE 2-continued

| Position of outermost-layer upper end (mm) | Deformation amount (mm) | Remarks | Yield (%) |
|---|---|---|---|
| 35 | 12 | unacceptable | 68 |
| 30 | 9 | unacceptable | 79 |
| 25 | 7 | unacceptable | 86 |
| 20 | 4 | acceptable | 100 |
| 15 | 2 | acceptable | 100 |
| 10 | 0 | acceptable | 100 |
| 5 | 0 | acceptable | 100 |
| 0 | 0 | cracked | 0 |

It was ascertained from the results in Table 2 that crack generation from around the opening of the crucible (from the upper end of the crucible) and the inward deformation (inclination) of the upper-end region of the crucible were able to be inhibited in cases when the upper end of the outermost layer was in the range of 5-20 mm, i.e., in a region extending from the upper end of the crucible downward to a distance therefrom of 5 mm or longer but not longer than the distance of sum (23 mm) of the wall thickness of 13 mm of the upper end and 10 mm.

Furthermore, it is possible to attain improvements in crucible durability and the degree of conversion into single crystal and to overcome the problem that single-crystal silicon has a defect of crystal quality due to the inward deformation (inclination) of the crucible upper-end region.

It was ascertained from the experimental results of the Examples that crack generation from around the opening of the crucible (from the upper end of the crucible) and the inward deformation (inclination) of the upper-end region of the crucible can be inhibited in cases when the upper end of the outermost layer is in a region extending from the upper end of the crucible downward to a distance therefrom of 5 mm or longer but not longer than the distance of sum of the wall thickness of the upper end and 10 mm.

(Experiment 3)

In Example 1-9, in which the crucible upper-end region having a two-layer structure had been set so as to extend from the upper end of the crucible downward to a distance of 10 mm therefrom, the crystallization-promoter concentrations in the outer layer 2 and the concentration ratio thereof were set at the values shown in Table 3.

The results of Experiment 3 are shown in Table 3.

In Table 3, the deformation amount indicates the amount in which the upper end of each crucible became inclined inward. The yield indicates the degree of conversion into single crystal. In the remarks, each crucible in which the pulling of single-crystal silicon was able to be continued is indicated by "acceptable", and each crucible which cracked to make the pulling of single-crystal silicon unable to be continued is indicated by "unacceptable".

The present invention has been described in detail with reference to specific embodiments, but it will be apparent to those skilled in the art that various changes and modifications can be made without departing from the spirit and scope of the present invention. The present application is based on Japanese Patent Application (No. 2018-233607) filed on Dec. 13, 2018, Japanese Patent Application (No. 2018-244033) filed on Dec. 27, 2018, Japanese Patent Application (No. 2019-181105) filed on Oct. 1, 2019, and Japanese Patent Application (No. 2019-181106) filed on Oct. 1, 2019, and the entirety of which is incorporated by reference.

REFERENCE SIGNS LIST

1 Silica-glass crucible
2 Outer layer made of crystallization-promoter-containing silica glass
3 Opaque interlayer
4 Transparent inner layer
5a Opaque outer layer
5b Opaque outer layer
6 Upper end of crucible
7 Lateral part
8 Bottom corner
9 Bottom part
10 Crucible upper-end region
30 Silica-glass crucible production device
T Wall thickness of upper end of crucible
h Distance from upper end of crucible

What is claimed is:

1. A silica-glass crucible, comprising:
a bottom part;
a bottom corner formed around the bottom part;
a lateral part extending upward from the bottom corner; and
Al and Ca,
wherein:
the silica-glass crucible has a crucible upper-end region at an end of the lateral part opposite the bottom corner;
the crucible upper-end region is a region extending from an upper end of the crucible downward to a distance therefrom of 5 mm or longer but not longer than a distance of a sum of an upper-end wall thickness and 10 mm;
the crucible upper-end region has the wall thickness of 10-18 mm;
the crucible upper-end region has a two-layer structure comprising an opaque outer layer comprising a natural-material-derived silica glass and a transparent

TABLE 3

| Al concentration (wt ppm) | Ca concentration (wt ppm) | Al/Ca concentration ratio | Position of outermost-layer upper end (mm) | Deformation amount (mm) | Remarks | Yield (%) |
|---|---|---|---|---|---|---|
| 20 | 0.1 | 200 | 10 | 0 | acceptable | 100 |
| 9 | 0.1 | 90 | 10 | 1 | acceptable | 100 |
| 20 | 0.5 | 40 | 10 | 2 | acceptable | 100 |
| 15 | 0.6 | 25 | 10 | 2 | acceptable | 100 |
| 9 | 0.6 | 15 | 10 | 2 | acceptable | 100 |
| 40 | 0.1 | 400 | 10 | 0 | unacceptable[1] | 30 |
| 20 | 2 | 10 | 10 | 3 | unacceptable[2] | 50 |

[1] Unacceptable because of cracks due to excessive devitrification.
[2] Unacceptable because of deformation due to insufficient crystallization.

inner layer comprising a natural-material-derived silica glass or a synthetic-material-derived silica glass; and the silica-glass crucible has a structure comprising at least three layers comprising, from a lower end of the crucible upper-end region, an outer layer comprising a crystallization-promoter-containing silica glass, an opaque interlayer which is continuously formed from the opaque outer layer of the crucible upper-end region, and the transparent inner layer.

2. The silica-glass crucible according to claim 1, wherein the crystallization-promoter-containing silica glass comprises Al and Ca, has an aluminum concentration of 9-20 wt ppm and a calcium concentration of 0.1-0.6 wt ppm, and has a molar concentration ratio (Al/Ca) between Al and Ca in a range of 15≤Al/Ca≤200.

3. The silica-glass crucible according to claim 1, having a four-layer structure comprising an opaque outer layer comprising a natural-material-derived silica glass superposed on an outer surface of the outer layer comprising the crystallization-promoter-containing silica glass.

4. The silica-glass crucible according to claim 1, wherein the crucible upper-end region further has a three-layer structure comprising the two-layer structure and a first outer layer made of silica glass that does not contain a crystallization promoter, and from the lower end of the crucible upper-end region, the structure comprises at least four layers comprising the at least three layers and a second outer layer, made of crystallization-promoter-containing silica glass, disposed on an outer side of the first outer layer.

* * * * *